United States Patent
Ray et al.

(10) Patent No.: US 10,511,294 B2
(45) Date of Patent: *Dec. 17, 2019

(54) CROSS-POINT OFFSET ADJUSTMENT CIRCUIT

(71) Applicant: FINISAR CORPORATION, Sunnyvale, CA (US)

(72) Inventors: Sagar Ray, San Jose, CA (US); Arash Izadi, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/181,276

(22) Filed: Nov. 5, 2018

(65) Prior Publication Data

US 2019/0123726 A1    Apr. 25, 2019

Related U.S. Application Data

(63) Continuation of application No. 15/699,139, filed on Sep. 8, 2017, now Pat. No. 10,122,353.

(60) Provisional application No. 62/385,394, filed on Sep. 9, 2016.

(51) Int. Cl.
H03L 5/00       (2006.01)
H03K 5/003      (2006.01)
H03K 5/24       (2006.01)

(52) U.S. Cl.
CPC .......... *H03K 5/003* (2013.01); *H03K 5/2418* (2013.01)

(58) Field of Classification Search
CPC ....................................................... H03K 5/003
See application file for complete search history.

(56) References Cited

U.S. PATENT DOCUMENTS

| | | |
|---|---|---|
| 7,227,409 B2 | 6/2007 | Chung |
| 7,409,199 B2 | 8/2008 | Igarashi et al. |
| 7,734,273 B2 | 6/2010 | Komori et al. |
| 8,098,099 B2 | 1/2012 | Kao et al. |
| 8,379,702 B2 | 2/2013 | Lutz |
| 8,457,190 B2 | 6/2013 | Raghavan et al. |
| 8,558,611 B2 | 10/2013 | Bulzacchelli et al. |
| 8,787,503 B2 | 7/2014 | Simmonds |
| 10,122,353 B2 * | 11/2018 | Ray .......... H03K 5/003 |

OTHER PUBLICATIONS

U.S. Appl. No. 15/699,139 Office Action dated May 8, 2018, 10pgs.

* cited by examiner

*Primary Examiner* — Kenneth B Wells
(74) *Attorney, Agent, or Firm* — Maschoff Brennan

(57) ABSTRACT

A differential signal offset adjustment circuit may include a first circuit for receiving a first one of a differential input signal and generating a first one of a differential output signal with positive offset based on a differential offset signal. The circuit may further include a second circuit for receiving a second one of a differential input signal and generating a second one of a differential output signal with a negative offset based on the differential offset signal.

20 Claims, 6 Drawing Sheets

CROSS-POINT OFFSET ADJUSTMENT CIRCUIT

CROSS-REFERENCE TO RELATED APPLICATION

This application is a Continuation of U.S. patent application Ser. No. 15/699,139, filed Sep. 8, 2017, titled CROSS-POINT OFFSET ADJUSTMENT CIRCUIT, issued Nov. 6, 2018 as U.S. Pat. No. 10,122,353, which claims benefit of and priority to the Sep. 9, 2016 filing date of the U.S. Patent Provisional Application No. 62/385,394, titled CROSS-POINT OFFSET ADJUSTMENT CIRCUIT. Both Applications are incorporated herein by reference in their entireties.

TECHNICAL FIELD

Embodiments described herein generally relate to receivers and, more particularly, to adjustment of a cross-point for signal detection.

BACKGROUND

Many high speed data transmission networks rely on transceivers, including optical transceivers and similar devices, for facilitating transmission and reception of digital data embodied in the form of, for example, optical signals over optical fibers. Typically, data transmission in such networks utilizes an electro-optic transducer emitting light when current is passed there through with the intensity of the emitted light being a function of the current magnitude through the transducer. Data reception is generally implemented by way of an optical receiver (also referred to as an optoelectronic transducer), an example of which is a photodiode. The optoelectronic transducer receives light and generates a current, the magnitude of the generated current being a function of the intensity of the received light.

During the operation of an optical transceiver, it is often important to evaluate the quality of a received data signal. One tool often used to help in the evaluation process is an eye diagram or pattern. As is well known, an eye diagram is formed by superimposing a long stream of random bits on one another on an oscilloscope or like device. The bit streams include the transitions from high to low and low to high. Several system performance measures can be derived by analyzing the eye diagram. For example, if the signals are too long, too short, poorly synchronized with the system clock, too high, too low, too noisy, too slow to change, or have too much undershoot or overshoot, this can be observed from the eye diagram. In particular, an "open" eye diagram corresponds to minimal signal distortion.

As stated, the eye diagram may provide information of the digital data signal and the optical system such as channel noise, inter-symbol interference (ISI), performance of a transmitter, or some combination thereof within a particular signaling interval. Opening the eye generally refers to improving the eye diagram, which may occur through adjusting an offset of the input signals.

The eye diagram may also be used to observe the cross-point. The cross-point is the point on the eye diagram where the transitions from high to low and low to high occur. For example, a digital low is often represented by a 0 volt signal and a digital high is represented by a 1 volt signal. Accordingly, in an ideal system, the cross-point would be observed at 0.5 volts.

One important task performed by a receiver of the transceiver is to determine if the bits of the received data signal represent a digital 0 (low) or a digital 1 (high). In order to perform such a task, circuitry in the post-amplifier reads the received data signal and makes the determination. In an ideal system with a cross-point at 0.5 volts, any signal of 0.49 volts and below would typically be determined to be a low and any signal of 0.51 volts or higher would typically be determined to be a high. However, it is often the case that noise and other signal offsets caused by fiber impurities, transistor mismatch, and the like cause distortion in the received signals. For example, added noise may cause a signal to be incorrectly determined as a high signal. It would therefore be advantageous to have the ability to adjust the cross-point of the received signals up or down (i.e., higher or lower than 0.5 volts) to help compensate for any signal impurities.

Another requirement might be to scan the eye diagram at different points of the XY graph to evaluate the quality of the received data quantitatively. While the scanning along the X-axis may be achieved by moving the sampling instant of the observing system, the scanning along the Y-axis requires an advertent offset to be inserted that can be achieved by crosspoint adjust circuits.

The subject matter claimed herein is not limited to embodiments that solve any disadvantages or that operate only in environments such as those described above. Rather, this background is only provided to illustrate one example technology area where some embodiments described herein may be practiced.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which.

DETAILED DESCRIPTION

Reference will now be made to the figures wherein like structures will be provided with like reference designations. It is understood that the drawings are diagrammatic and schematic representations of exemplary embodiments of the invention, and are not limiting of the present invention nor are they necessarily drawn to scale. As used herein, a signal on a conductor may simply be referred to as the "signal" rather than the signal on a conductor or node.

In general, embodiments of the present invention relate to an open loop slice adjustment and offset correction circuit with bandwidth enhancement. Some embodiments described herein relate to a differential signal offset adjustment circuit. More specifically, the differential signal offset adjustment circuit includes a first circuit for receiving a first one of a differential input signal and generating a first one of a differential output signal with positive offset based on a differential offset signal. The differential signal adjustment circuit further includes a second circuit for receiving a second one of a differential input signal and generating a second one of a differential output signal with a negative offset based on the differential offset signal.

Another embodiment includes a method for generating and offsetting the differential output voltages. More specifically, the method includes receiving a first one of a differential input signal at a first circuit and generating a first one of a differential output signal with positive offset based on a differential offset signal. The method further includes receiving a second one of the differential input signal at a second circuit and generating a second one of the differential output signal with a negative offset based on the differential offset signal.

Figure 1:
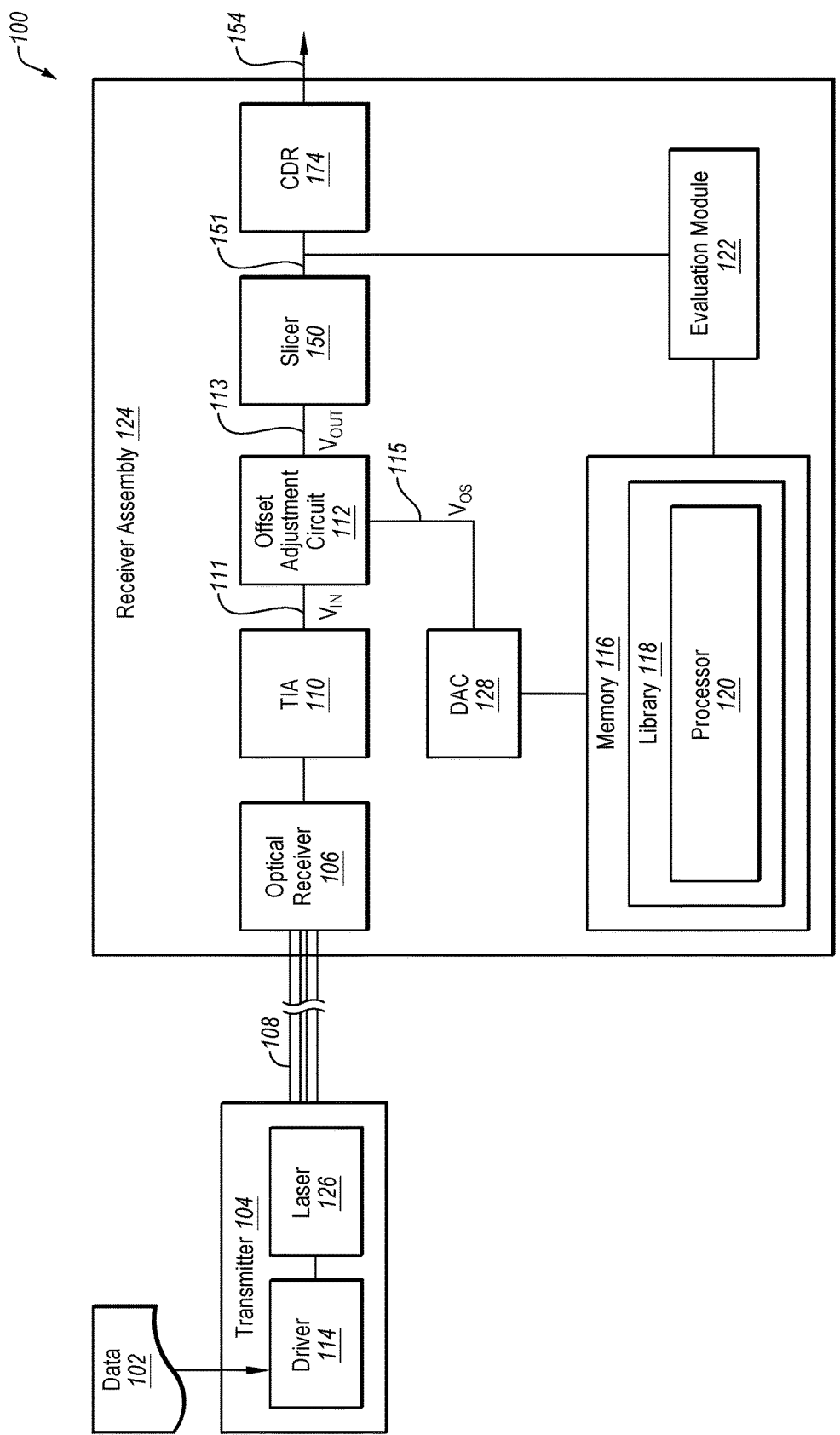
FIG. 1 illustrates a block diagram of an optical system, in accordance with an exemplary embodiment.

FIG. 1 illustrates a block diagram of an example optical system 100 in which some embodiments described herein may be implemented. The optical system 100 may be configured for offset correction and bandwidth enhancement. As used herein, offset correction may indicate adjustment of an offset, and slicing a threshold or a cross-point of data signals in an open loop amplifier configuration. The one and zero level in a data signal can be corrupted differently due to device or channel imperfections in a transceiver link. For example, the one level at the output of an avalanche photodiode (APD) or transimpedance amplifier (TIA) connected to it may suffer from higher noise than the zero level when the light is absent. Furthermore, the eye quality of the transceiver link may be monitored by mapping the sampling point across the eye and measuring the bit-error rate at each point. The slicing threshold of the data may be moved vertically by inserting an adjustable offset.

In FIG. 1, the optical system 100 may be configured for adaptation for offset correction and bandwidth enhancement. Some embodiments of the optical system 100 may be a multi-mode optical system such as an optical system substantially conforming to the 100GBASE-SR4 standard or another suitable Ethernet data communication standard. In these embodiments, the optical system 100 may include a multi-mode fiber (MMF) that substantially conforms to the OM3 standard, for instance.

In the embodiment depicted in FIG. 1, the optical system 100 is configured to communicate digital data 102 in the form of optical signals from a transmitter 104 to a receiver assembly 124 via an MMF 108. The transmitter 104 may include a laser 126 or another suitable optical signal source. The laser 126 may include a vertical cavity surface-emitting laser (VCSEL) or a directly modulated laser (DML), for instance. The transmitter 104 may also include a driver 114 that is configured to drive the laser 126.

The digital data 102 may include non-return to zero (NRZ) data, for instance. The NRZ data may be configured to be communicated at a symbol rate of 25.8 gigabaud per second (Gb/s) or other suitable symbol rate. The digital data 102 may be representative of some occurrence or state, and accordingly the digital data 102 may be random.

The receiver assembly 124 may include an optical receiver 106, a transimpedence amplifier (TIA) 110, an offset adjustment circuit 112, a clock and data recovery circuit (CDR) 174, a memory 116, and an evaluation module 122. The optical receiver 106 may convert the optical signals communicated along the MMF 108 to electrical signals representative of the optical signals. The optical receiver 106 may include a photodiode, for example. The TIA 110 may receive the electrical signals from the optical receiver 106 and may be configured to amplify the electrical signals into differential input signal $V_{IN}$ 111. The electrical signals may then be communicated to the offset adjustment circuit 112, which may be configured to generate an offset in the electrical signals to adjust a cross-point of the electrical signals. Offset-adjusted signals 113 may then be communicated from the offset adjustment circuit 112 to a slicer 150 and then to the CDR 174.

The offset adjustment circuit 112 may be configured for adjusting an offset of the differential input signal $V_{IN}$ 111 output from the TIA 110. Additionally, the offset adjustment circuit 112 may be configured to generate an offset during communication of the digital data 102 in the optical system 100. The offset adjustment circuit 112 may include an offset circuit for adjusting the offset and a slicer, such as a zero-level slicer. In embodiments in which the offset adjustment circuit 112 includes the offset circuit for adjusting the offset and a slicer, the offset may be adjusted in an open loop.

The offset adjustment circuit 112 may be communicatively coupled to the memory 116. For example, the offset adjustment circuit 112 may be configured to receive voltage offset signals $V_{OS}$ 115 as generated by a digital-to-analog (DAC) converter 128 in response to offset adjustment settings stored at least temporarily in the memory 116.

The memory 116 may be a DRAM device, an SRAM device, flash memory, or some other memory device. In some embodiments, the memory 116 may also include a non-volatile memory or similar permanent storage device for storing information on a more permanent basis. The memory 116 may be an example of a non-transitory computer-readable medium such as RAM, ROM, EEPROM, flash memory, or other memory technology, or any other non-transitory computer-readable medium executable by a processor 120. The memory 116 may be allocated for other purposes such as storage of instructions and or data that may be implemented by one or more processors 120. These instructions may be executed to perform one or more techniques described herein.

A library 118 may be configured to store one or more settings for controlling the DAC 128 for generating the offset control input $V_{OS}$ 115. The offset control voltage $V_{OS}$ 115 may be an example of control settings communicated to the offset adjustment circuit 112. The control settings may be determined by various testing and design and may also be determined based on an analysis by the evaluation module 122. The analysis from the evaluation module 122 may yield data for storing in memory 116 which, in turn, may be used to generate the one or more control settings for controlling the DAC 128 to generate the offset control input $V_{OS}$ to the offset adjustment circuit 112.

The slicer 150 may provide a feedback signal such as binary output signal 151 to the offset adjustment circuit 112 and the CDR 174 may further communicate a data signal 154 indicative of the digital data 102. The evaluation module 122 may be configured to receive the offset adjusted signals 113 communicated from the offset adjustment circuit 112. The evaluation module 122 may determine signal quality, including an eye opening of the offset adjusted signals 113.

The evaluation module 122 may include an EOM or any other suitable system configured to receive the binary output signal 151 or another signal indicative of signal quality and evaluate signal quality based thereon. For example, in some embodiments, the evaluation module 122 may include an EOM. The EOM may generate eye diagrams or approximate metrics of an eye quality from the binary output signal 151. Additionally, the EOM may be configured to compare multiple eye diagrams generated from multiple sets of offset signals received from the offset adjustment circuit 112.

Figure 2:
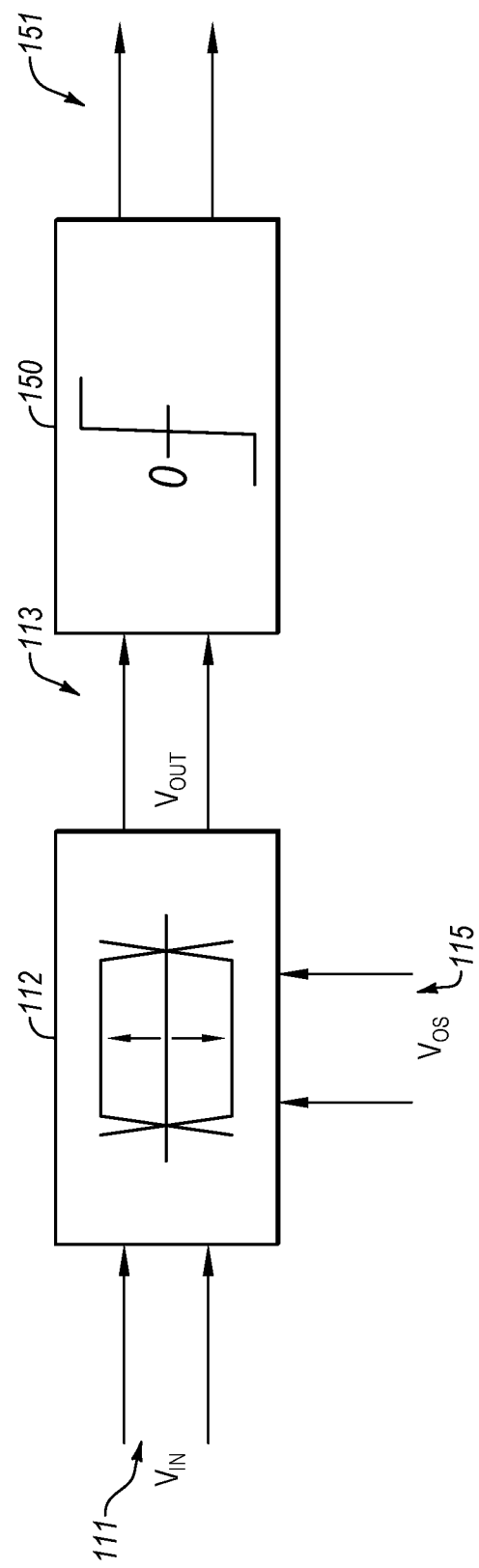
FIG. 2 illustrates a block diagram of the offset adjustment circuit, in accordance with an exemplary embodiment.

FIG. 2 illustrates a block diagram of the offset adjustment circuit of an example embodiment of the offset adjustment circuit 112 of FIG. 1. The offset adjustment circuit 112 receives two differential input signals and generates a single output signal. As illustrated, a differential input signal $V_{IN}$ 111 is received from the amplifier 110 or other filter or buffer.

The first input, namely a differential input signal $V_{IN}$ 111, includes differential input signals $V_{IN}+$ and $V_{IN}-$ which each exhibit a substantially equal DC offset level. The second input, namely a differential offset adjustment voltage $V_{OS}$ 115, includes differential voltage offset signals $V_{OS}+$ and $V_{OS}-$ which exhibit a selected or specified adjusted offset voltage. The output, namely the differential offset adjusted signals 113, includes differential offset signals $V_{OUT}+$ and $V_{OUT}-$ which each exhibit different DC offset levels. The difference in the DC offset levels of the differential offset signals $V_{OUT}+$ and $V_{OUT}-$ is substantially equal to the differential voltage offset adjustment voltage $V_{OS}$ 115.

A slicer 150 couples to the offset adjustment circuit 112. The slicer 150 may be configured as a 0-level slicer which generates binary output signals 151 based upon the offset-adjusted signals 113. The binary output signals 151 then couple to the input of the CDR 174 of FIG. 1.

Figure 3:
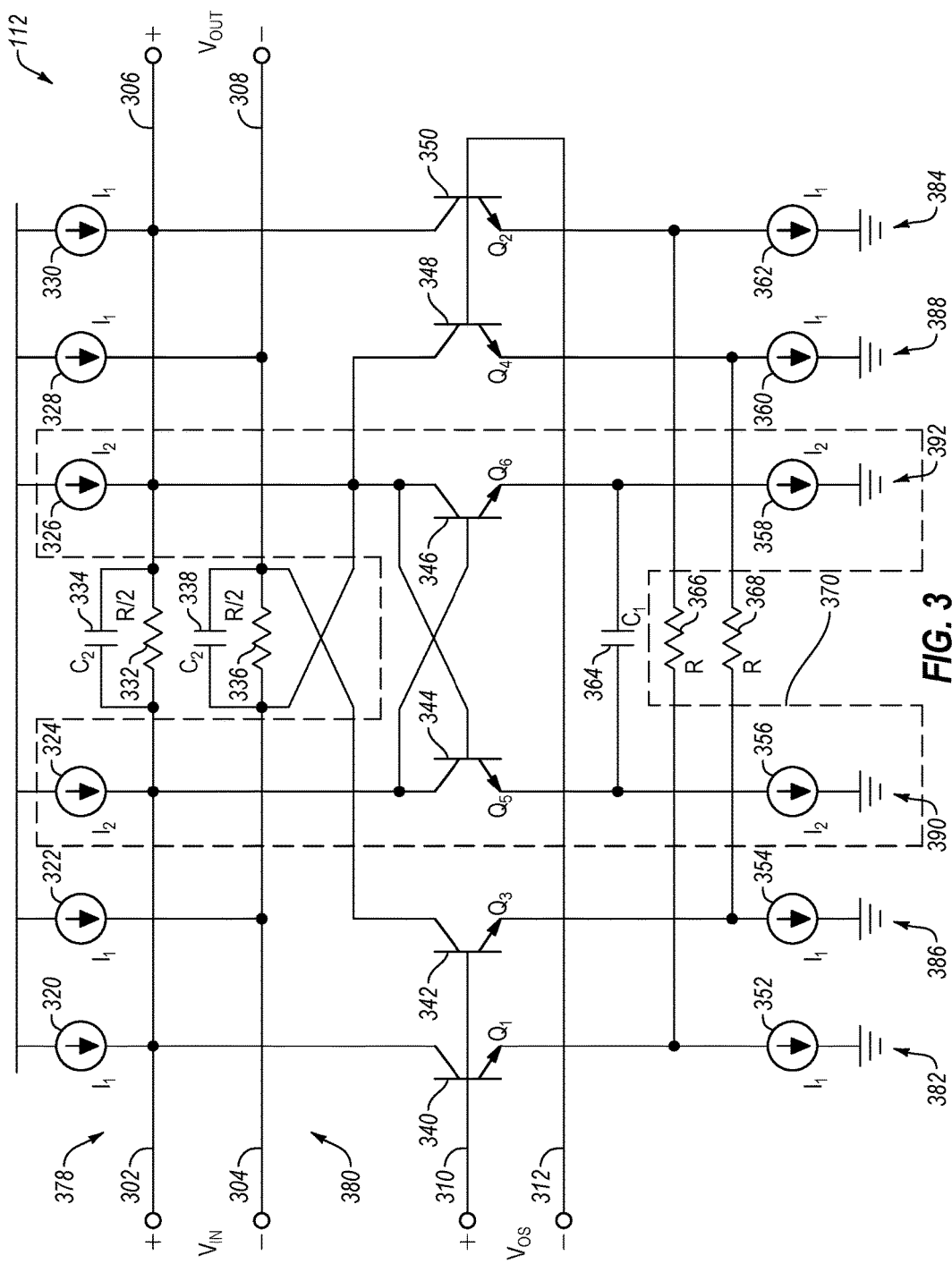
FIG. 3 illustrates a circuit diagram of an offset adjustment circuit, in accordance with an exemplary embodiment.

FIG. 3 illustrates a circuit diagram of an offset adjustment circuit 112, in accordance with an exemplary embodiment. The differential offset adjustment circuit 112 includes a first circuit 378 for receiving a first one of a differential input signal and generating a first one of a differential output signal with positive offset based on a differential offset signal. The differential offset adjustment circuit 112 also includes a second circuit 380 for receiving a second one of a differential input signal and generating a second one of a differential output signal with a negative offset based on the differential offset signal.

The first circuit 378 includes a first branch 382 including a first transistor 340 coupled between a first current source 320 and a second current source 352. The first transistor 340 includes a collector terminal coupled to the first current source 320 and an emitter terminal coupled to the second current source 352. The first current source 320 and the second current source 352 are preferably matched and source/sink equivalent amounts of current.

The first transistor 340 further includes a base terminal coupled to the first one of the differential offset signal $V_{OS}+$ 310. The collector terminal of the first transistor 340 further couples to the first one of the differential input signal Vin+ 302.

The first circuit 378 further includes a second branch 384 including a second transistor 350 coupled between a third current source 330 and a fourth current source 362. The second transistor 350 includes a collector terminal coupled to the third current source 330 and an emitter terminal coupled to the fourth current source 362. The third current source 330 and the fourth current source 362 are preferably matched and source/sink equivalent amounts of current.

The second transistor 350 further includes a base terminal coupled to the second one of the differential offset signal VOS− 312. The collector terminal of the second transistor 350 further couples to the first one of the differential output signal Vout+ 306.

The second circuit 380 includes a third branch 386 including a third transistor 342 coupled between a fifth current source 328 and a sixth current source 354. The third transistor 342 includes a collector terminal coupled to the fifth current source 328 and an emitter terminal coupled to the sixth current source 354. The fifth current source 328 and the sixth current source 354 are preferably matched and source/sink equivalent amounts of current.

The third transistor 342 further includes a base terminal coupled to the first one of the differential offset signal $V_{OS}+$ 310. The collector terminal of the third transistor 342 further couples to the second one of the differential output signal $V_{OUT}-$ 308.

The second circuit 380 further includes a fourth branch 388 including a fourth transistor 348 coupled between a seventh current source 322 and an eighth current source 360. The fourth transistor 348 includes a collector terminal coupled to the seventh current source 322 and an emitter terminal coupled to the eighth current source 360. The seventh current source 322 and the eighth current source 360 are preferably matched and source/sink equivalent amounts of current.

The fourth transistor 348 further includes a base terminal coupled to the second one of the differential offset signal $V_{OS}-$ 312. The collector terminal of the fourth transistor 348 further couples to the second one of the differential input signal Vin− 304.

The differential signal offset adjustment circuit 112 further includes a first resistor 332 coupled between the first one of the differential input signal Vin+ 302 and the first one of the differential output signal $V_{OUT}+$ 306. The differential signal offset adjustment circuit 112 further includes a first capacitor 334 in parallel with the first resistor 332. The differential signal offset adjustment circuit 112 yet further includes a second resistor 366 coupled between the first branch 382 and the second branch 384.

The differential signal offset adjustment circuit 112 further includes a third resistor 336 coupled between the second one of the differential input signal Vin− 304 and the second one of the differential output signal $V_{OUT}-$ 308. The differential signal offset adjustment circuit 112 further includes a second capacitor 338 in parallel with the third resistor 336. The differential signal offset adjustment circuit 112 yet further includes a fourth resistor 368 coupled between the third branch 386 and the fourth branch 388.

The differential signal offset adjustment circuit 112 further includes a bandwidth enhancement circuit 370 coupled between the first one of the differential input signal $V_{IN}+$ 302 and the second one of the differential input signal $V_{IN}-$ 304.

The bandwidth enhancement circuit 370 includes a fifth branch 390 including a fifth transistor 344 coupled between a ninth current source 324 and a tenth current source 356. The fifth transistor 344 includes a collector terminal coupled to the ninth current source 324 and an emitter terminal coupled to the tenth current source 356. The ninth current source 324 and the tenth current source 356 are preferably matched and source/sink equivalent amounts of current.

The bandwidth enhancement circuit 370 further includes a sixth branch 392 including a sixth transistor 346 coupled between an eleventh current source 326 and a twelfth current source 358. The sixth transistor 346 includes a collector terminal coupled to the eleventh current source 326 and an emitter terminal coupled to the twelfth current source 358. The eleventh current source 326 and the twelfth current source 358 are preferably matched and source/sink equivalent amounts of current.

The fifth transistor 344 further includes a base terminal coupled to the collector terminal of the sixth transistor 346. The sixth transistor 346 further includes a base terminal coupled to the collector terminal of the fifth transistor 344. The emitter terminal of the fifth transistor 344 may be connected to the emitter terminal of the sixth transistor 346 by a capacitor 364.

In operation, the offset adjustment circuit 112 may provide for adjustment of the offset, slicing threshold or crosspoint of data signals in an open loop amplifier configuration. The "one" and "zero" level in a data signal may become differently corrupted due to device or channel imperfections in a transceiver link. For example, the "one" level at the output of an avalanche photodiode (APD) or transimpedance amplifier (TIA), such as amplifier 110, may suffer from higher noise than the "zero" level when light is absent. Furthermore, monitoring the eye quality of a transceiver link may include mapping the sampling point across the eye and measuring the bit-error rate at each point. For the adjustment of the offset, slicing threshold or cross-point of the data signals, the slicing threshold of the data may be moved vertically by inserting an adjustable offset.

Various benefits of the offset adjustment circuit 112 may be realized. In an exemplary embodiment, an offset voltage nominally equal to the externally set value can be achieved without using negative feedback loops that consume a significant on-chip passive area. This may be achieved by maintaining approximately a 1:2 ratio of load and degeneration resistances and ensuring good matching conditions of the surrounding devices.

Furthermore in the offset adjustment circuit 112, a degeneration or gain may be introduced in the offset adjustment voltage $V_{OS}$ 310, 312 by changing the resistor ratio from 1:2 and increasing/decreasing the value of $I_1$ for the current sources of FIG. 3. Moreover, the dynamic range and gain of the offset control may be set independent of each other by changing the load and degeneration resistor values, respectively.

Yet further, DC offset arising from fabrication mismatches inside the receiver assembly may exacerbate the eye quality and therefore the BER. Therefore, a significantly larger dynamic range of offset control may provide a benefit. Accordingly, a large voltage offset may be created either by a large offset current flowing through a typical resistor or a typical offset current flowing through a large resistor. The former case results in a large power dissipation while the latter reduces circuit speed. In the exemplary embodiment, a method for achieving a large offset without incurring too much power dissipation and loss of bandwidth is provided. For example, a large value of R in FIG. 3 may be chosen to allow a smaller value of offset current ($I_1$) and therefore, lower power dissipation. In order to restore the bandwidth lost due to a high value of R, a high-frequency bypass capacitor ($C_2$) and a bandwidth extension network ($Q_3$, $Q_4$, $I_2$ and $C_1$) may be utilized.

Also, due to the small quantity of stacked devices in each branch (for example, there are only three devices in the first branch from right, i.e. $I_1$, Q2 and $I_1$), the tolerable range of input and output DC voltages is large, allowing the devices to operate in their desirable operating regions even at the edges of the control region.

In another exemplary embodiment, the current through the current sources adjacent to the input stage ($I_1$ & $I_2$ at top left side) may be easily made part of the input circuitry (if needed) by simply eliminating the current sources. This embodiment may be more compatible with input circuitry that presents a low output impedance.

Also, due to the differential nature of the offset input stages ($Q_1$, $Q_3$ and $Q_2$, $Q_4$) and the large tolerance range of DC voltages as described above, the circuit may be insensitive to the common mode of the offset control input ($V_{OS}$) and therefore, may not require a differential current digital-to-analog converter (IDAC) or any other differential circuitry with controlled common mode to generate $V_{OS}$. Due to this common mode immunity, a single ended control embodiment of the present invention is possible by tying one node of the differential offset input to a fixed voltage and the other to a voltage determined by the required offset correction.

Further, the high input impedance at the signal input port ($V_{IN}$ connections in FIG. 3) allows the circuit to accept any input common mode voltage and passes it on to the output ($V_{OUT}$) after offset modification as specified by the user. In other words, the embodiment lets the circuit at the input decide the input/output common mode voltage.

The offset adjustment circuit 112 is self-contained and does not source/sink any current to/from input and output circuitry. Therefore, the input circuitry remains unaffected by the proposed slice adjust circuit and the operating point of the input is unaltered. In other words, unlike many other implementations where the circuit at the input gets effected by the offset setting, this circuit acts as a sense circuit at the input and does not modify the input signal either in common mode or differential manner.

Further, the current ($I_2$) and capacitance value ($C_1$) of the bandwidth enhancement circuit 370 is small by design to limit over-compensation and therefore does not require significant power or area consumption.

Figure 4:
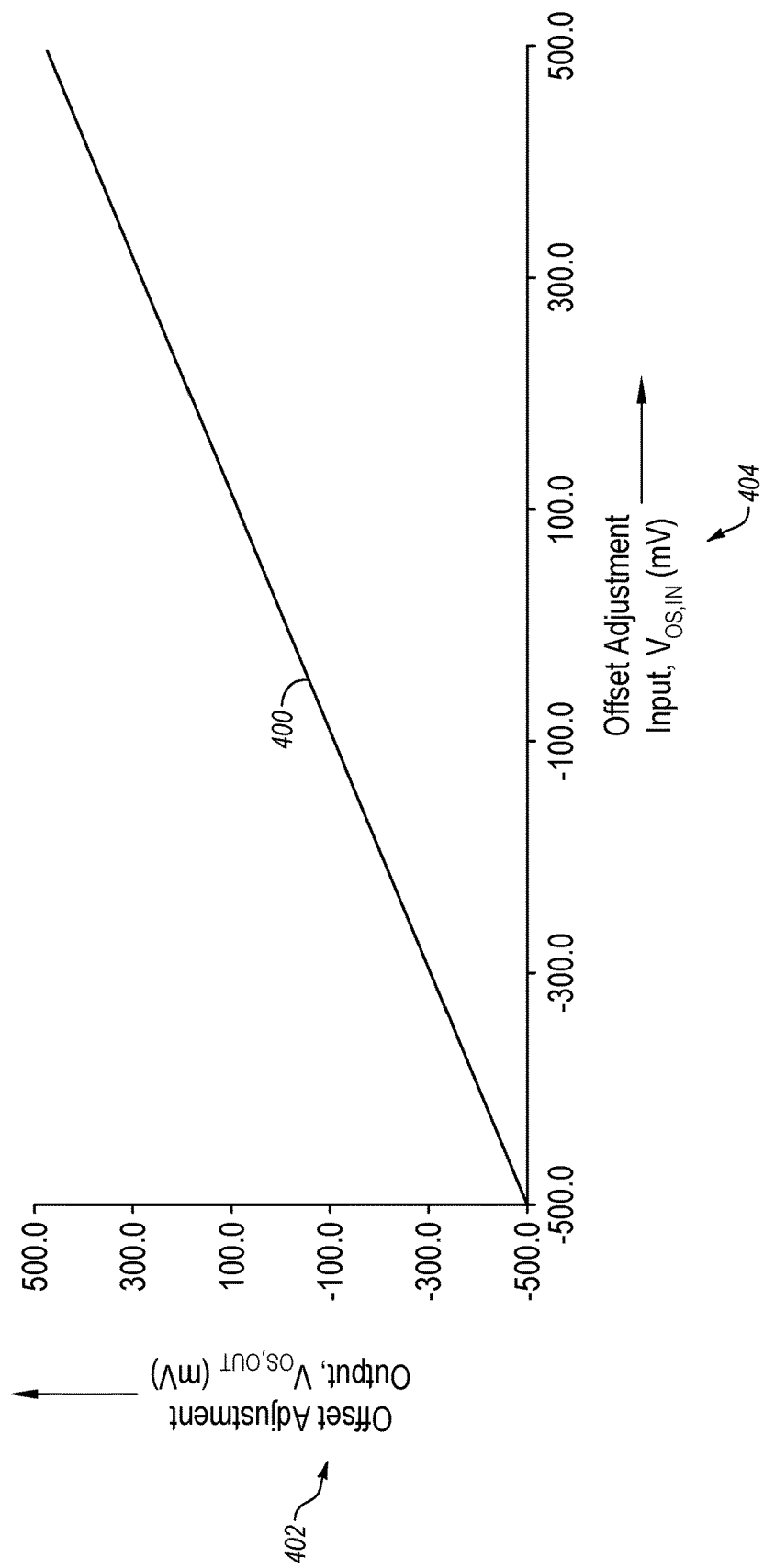
FIG. 4 illustrates a plot of an offset on the output signal with respect to the offset control voltage, in accordance with an exemplary embodiment.

FIG. 4 illustrates a plot of the offset on the output signal with respect to the offset control voltage. The x-axis 404 is a plot of the offset control voltage $V_{OS}$ 310/312. The y-axis 402 is a plot of the offset voltage as seen on the output signal $V_{OUT}$+ 306. The plot 400 illustrates the linear nature of the offset adjustment circuit 112 of FIG. 3.

Figure 5:
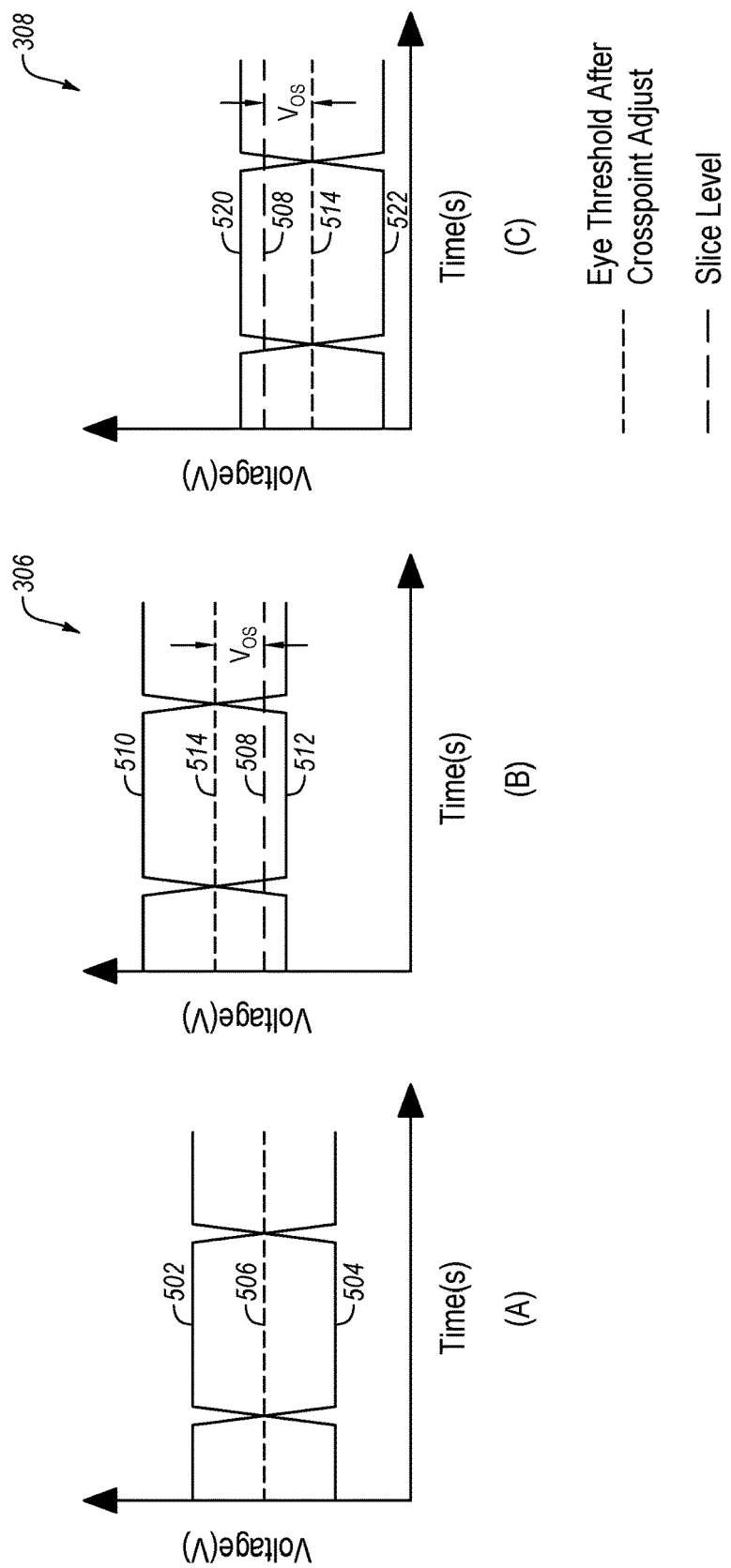
FIG. 5 illustrates plots of simulation results for an offset adjustment circuit, in accordance with an exemplary embodiment.

FIG. 5 illustrates plots of simulation results for the offset adjustment circuit 112 of FIG. 3. In plot (A) of FIG. 5, the output signal $V_{OUT}$ is plotted which illustrates an eye pattern having a "high" signal level at 502 and a "low" signal level at 504. The DC offset level 506 is centrally located between the high signal level 502 and the low signal level 504.

Plots (B) and (C) are single-ended plots of the output signal $V_{OUT}$. In plot (B), the positive output differential signal $V_{OUT}$+ 306 of FIG. 3 is plotted. The plot of positive output differential signal $V_{OUT}$+ 306 swings between a high signal level 510 and a low signal level 512. The offset signal level 514 is a combination of the DC offset of the input signal $V_{IN}$+ 302 and the offset inserted from the offset control voltage $V_{OS}$ 310/312. Plot (B) further illustrates a slice level 508 for future determination of the logic level of the output signal $V_{OUT}$+ 306.

In plot (C), the negative output differential signal $V_{OUT}$– 308 of FIG. 3 is plotted. The plot of negative output differential signal $V_{OUT}$– 308 swings between a high signal level 520 and a low signal level 522. The offset signal level 514 is a combination of the DC offset of the input signal $V_{IN}$– 304 minus the offset inserted from the offset control voltage $V_{OS}$ 310/312. Plot (C) further illustrates a slice level 508 for future determination of the logic level of the output signal $V_{OUT}$– 308.

Figure 6:
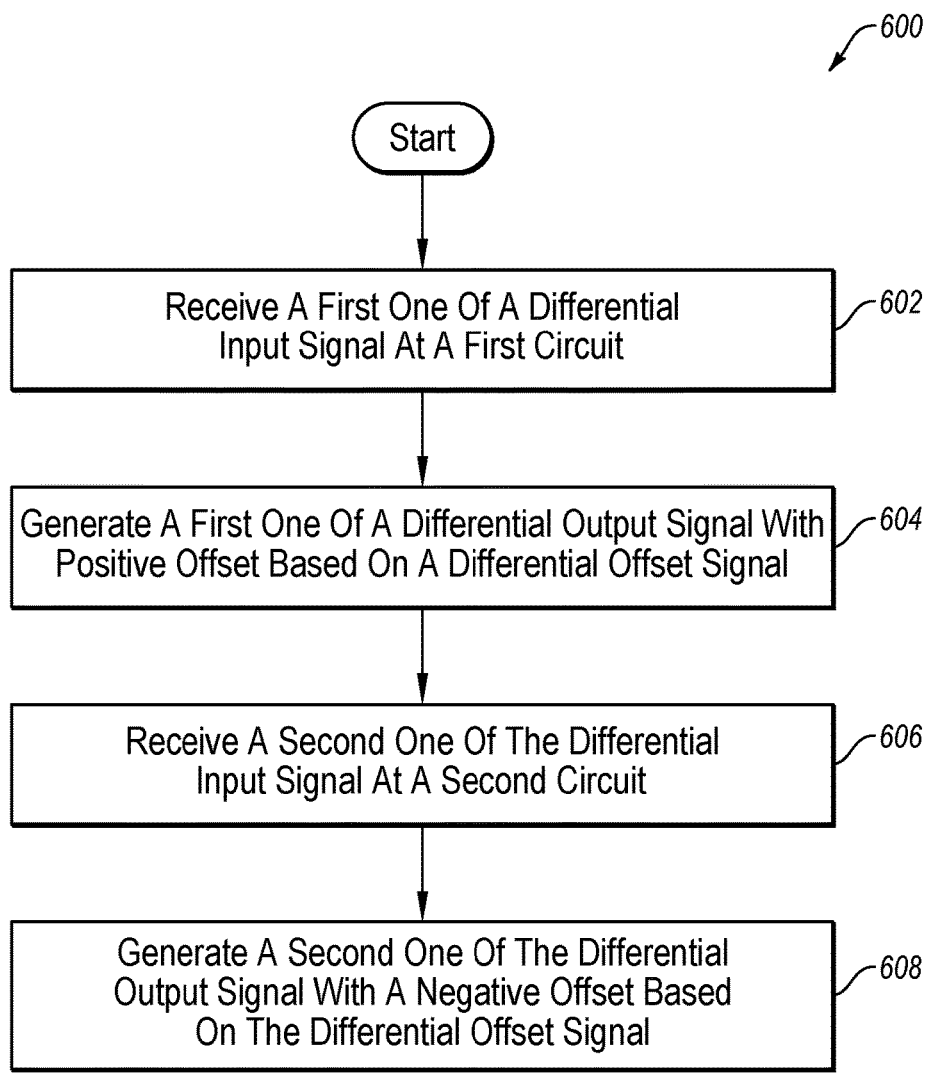
FIG. 6 illustrates a flowchart of a method for generating an offset voltage in a differential output signal, in accordance with an exemplary embodiment.

FIG. 6 illustrates a flowchart of a method 600 for generating an offset voltage in a differential output signal. In block 602, a first circuit receives a first one of a differential input signal. The first circuit 378, described above, receives the first one, for example differential input signal $V_{IN}+$ 302. In block 604, the first circuit generates a first one of a differential output signal with positive offset based on a differential offset signal. The first circuit 378 generates the first one, for example differential output signal $V_{OUT}+$ 306.

In block 606, a second circuit receives a second one of a differential input signal. The second circuit 380, described above, receives the second one, for example differential input signal $V_{IN}-$ 304. In block 608, the second circuit generates a second one of a differential output signal with negative offset based on a differential offset signal. The second circuit 380 generates the second one, for example differential output signal $V_{OUT}-$ 308.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A differential signal offset adjustment circuit, comprising:
   a first circuit operatively coupled to an amplification circuit so as to receive a first one of a differential input signal including a DC offset and configured to generate a first one of a differential output signal with a positive offset based on a combination of a differential offset signal and the DC offset; and
   a second circuit operatively coupled to the amplification circuit so as to receive a second one of the differential input signal including the DC offset and configured to generate a second one of the differential output signal with a negative offset based on a combination of the differential offset signal and the DC offset.

2. The differential signal offset adjustment circuit of claim 1, wherein the first circuit includes:
   a first branch that includes a first transistor coupled between a first current source and a second current source, and
   a second branch that includes a second transistor coupled between a third current source and a fourth current source.

3. The differential signal offset adjustment circuit of claim 2, further comprising a first resistor coupled between the first one of the differential input signal and the first one of the differential output signal.

4. The differential signal offset adjustment circuit of claim 3, further comprising a first capacitor in parallel with the first resistor.

5. The differential signal offset adjustment circuit of claim 3, further comprising a second resistor coupled between the first branch and the second branch.

6. The differential signal offset adjustment circuit of claim 2, wherein the second circuit includes:
   a third branch that includes a third transistor coupled between a fifth current source and a sixth current source, and
   a fourth branch that includes a fourth transistor coupled between a seventh current source and an eighth current source.

7. The differential signal offset adjustment circuit of claim 6, further comprising a third resistor coupled between the second one of the differential input signal and the second one of the differential output signal.

8. The differential signal offset adjustment circuit of claim 7, further comprising a second capacitor in parallel with the third resistor.

9. The differential signal offset adjustment circuit of claim 7, further comprising a fourth resistor coupled between the third branch and the fourth branch.

10. The differential signal offset adjustment circuit of claim 1, further comprising a bandwidth enhancement circuit coupled across the differential input signal.

11. A receiver assembly, comprising:
    an optical receiver configured to receive an optical signal and output an electrical signal representative of the optical signal;
    an amplification circuit operatively coupled to the optical receiver and configured to receive the electrical signal and amplify it into a differential input signal; and
    a differential signal offset adjustment circuit operatively coupled to the amplification circuit, the differential signal offset adjustment circuit comprising:
       a first circuit operatively coupled to the amplification circuit so as to receive a first one of the differential input signal including a DC offset and configured to generate a first one of a differential output signal with a positive offset based on a combination of a differential offset signal and the DC offset; and
       a second circuit operatively coupled to the amplification circuit so as to receive a second one of the differential input signal including the DC offset and configured to generate a second one of the differential output signal with a negative offset based on a combination of the differential offset signal and the DC offset.

12. The receiver assembly of claim 11, further comprising a memory operatively coupled to the differential signal offset adjustment circuit, wherein the memory stores offset adjustment settings that determine the differential offset signal.

13. The receiver assembly of claim 12, further comprising a digital-to-analog converter (DAC) operatively coupled between the memory and the differential signal offset adjustment circuit, wherein the DAC is configured to generate the differential offset signal in response to the offset adjustment settings stored in the memory.

14. The receiver assembly of claim 12, further comprising an evaluation module operatively coupled to the memory and the differential signal offset adjustment circuit, wherein the evaluation module is configured to generate an analysis of the differential output signal which may determine the offset adjustment settings.

15. The receiver assembly of claim 11, wherein the first circuit includes:
    a first branch that includes a first transistor coupled between a first current source and a second current source, and
    a second branch that includes a second transistor coupled between a third current source and a fourth current source.

16. The receiver assembly of claim 15, further comprising a first resistor coupled between the first one of the differential input signal and the first one of the differential output signal.

17. The receiver assembly of claim 16, further comprising a first capacitor in parallel with the first resistor.

18. The receiver assembly of claim 16, further comprising a second resistor coupled between the first branch and the second branch.

19. The receiver assembly of claim 15, wherein the second circuit includes:
   a third branch that includes a third transistor coupled between a fifth current source and a sixth current source, and
   a fourth branch that includes a fourth transistor coupled between a seventh current source and an eighth current source.

20. The receiver assembly of claim 11, further comprising a bandwidth enhancement circuit coupled across the differential input signal.

* * * * *